(12) United States Patent
Bultitude et al.

(10) Patent No.: US 9,025,311 B1
(45) Date of Patent: May 5, 2015

(54) VERY LARGE CERAMIC CAPACITOR WITH MECHANICAL SHOCK RESISTANCE

(71) Applicant: Kemet Electronics Corporation, Simpsonville, SC (US)

(72) Inventors: John Bultitude, Simpsonville, SC (US); John E. McConnell, Simpsonville, SC (US); Abhijit Gurav, Simpsonville, SC (US)

(73) Assignee: Kemet Electronics Corporation, Simpsonville, SC (US)

( * ) Notice: Subject to any disclaimer, the term of this patent is extended or adjusted under 35 U.S.C. 154(b) by 196 days.

(21) Appl. No.: 13/868,660

(22) Filed: Apr. 23, 2013

Related U.S. Application Data

(60) Provisional application No. 61/638,170, filed on Apr. 25, 2012.

(51) Int. Cl.
  *H01G 4/38* (2006.01)
  *H01G 4/40* (2006.01)

(52) U.S. Cl.
  CPC ........................................ *H01G 4/38* (2013.01)

(58) Field of Classification Search
  CPC .................................. H01G 4/38; H01G 4/40
  USPC .................... 361/329, 330, 321.6, 321.2, 749
  See application file for complete search history.

(56) References Cited

U.S. PATENT DOCUMENTS

| | | | |
|---|---|---|---|
| 6,563,691 B2 * | 5/2003 | Kijima et al. | 361/328 |
| 7,604,591 B2 | 10/2009 | Uchiyama et al. | |
| 8,407,871 B2 | 4/2013 | Taylor et al. | |
| 8,564,966 B2 * | 10/2013 | Kitagawa et al. | 361/760 |
| 8,760,847 B2 * | 6/2014 | Dooley et al. | 361/328 |
| 8,787,003 B2 * | 7/2014 | Domes et al. | 361/538 |
| 8,873,219 B2 * | 10/2014 | Perea et al. | 361/303 |
| 8,910,356 B2 * | 12/2014 | Randall et al. | 29/25.42 |
| 2007/0143993 A1 | 6/2007 | Hsu | |
| 2009/0212883 A1 * | 8/2009 | Albrecher et al. | 333/182 |
| 2010/0254108 A1 * | 10/2010 | Kim et al. | 361/782 |
| 2011/0043963 A1 * | 2/2011 | Bultitude et al. | 361/321.4 |
| 2013/0343027 A1 * | 12/2013 | Perea et al. | 361/813 |
| 2014/0055213 A1 * | 2/2014 | Sherwood et al. | 333/185 |

* cited by examiner

*Primary Examiner* — Jeremy C Norris
*Assistant Examiner* — Nathan Milakovich
(74) *Attorney, Agent, or Firm* — Joseph T. Guy; Perkins Law Firm, LLC

(57) ABSTRACT

An improved high capacitance module for multi-layer ceramic capacitors is described. The module contains a flexible substrate comprising at least one first conductive trace and at least one second conductive trace. A first termination trace is in electrical connection with each first trace and a second termination trace is in electrical connection with each second trace. Each capacitor comprises interleaved conductors wherein alternate conductors are terminated to a first external termination and adjacent conductors are terminated to a second external termination. Each capacitor is mounted on the substrate with the first termination in electrical contact with the first trace and the second termination in electrical contact with the second trace. A housing with the substrate is received in the housing. A first lead tab is in electrical contact with the first termination wherein the first lead tab extends from the housing.

20 Claims, 14 Drawing Sheets

VERY LARGE CERAMIC CAPACITOR WITH MECHANICAL SHOCK RESISTANCE

CROSS-REFERENCE TO RELATED APPLICATIONS

The present invention claims priority to U.S. Provisional Patent Application No. 61/638,170 filed Apr. 25, 2012 which is incorporated herein by reference.

BACKGROUND

The present invention is related to large capacitors with arrays, or parallel banks, of multilayered ceramic capacitors (MLCC's). More specifically, the present invention is related to very large arrays of MLCC's on a flexible support, preferably in electrical parallel, with protection from mechanical stresses.

MLCC's are typically produced in relatively small case sizes as discrete components. Other capacitor technologies, such as film capacitors, can be formed as large devices and wound or stacked to produce large bricks. Similarly, electrolytic type capacitors can be made using large cans or housings. Unfortunately, film and electrolytic capacitors perform poorly in some environments such as at elevated temperatures which limits their use.

MLCC's exhibit some desirable properties such as the ability to withstand higher temperature however, in order to realize these benefits the smaller MLCC's have to be stacked into large rigid arrays to achieve the higher capacitance needed for many applications. This stacking is usually achieved by soldering or bonding the terminals of a stack of MLCC's to a lead frame. The subsequent stack is then attached to the circuit of the final device to form electrical and mechanical contacts. These lead frames offer some additional robustness with respect to resisting an external bending force applied to the device during assembly or application and with respect to coefficient of thermal expansion mismatch on temperature cycling. Unfortunately, the large mass of the leaded stack causes the stack to be more prone to failures caused by mechanical shock. If the final assembled device is dropped the energy can be transferred through the attached lead frame causing cracks in the ceramic, or attachments, which leads to electrical failure.

Those of skill in the art have been limited to the use of either a large capacitor, with film or electrolytic technologies, which are incapable of withstanding adverse environmental conditions, or stacks of MLCC's attached to leads which are unsuitable for harsh mechanical conditions. There has been a continuous need in the art for a capacitor which can withstand both environmental deviations from normal and mechanical shock. This need has not been previously met.

Provided herein is a large packaged array of ceramic based capacitors with improved resilience to subsequent mechanical shocks. This is achieved by assembling MLCC's into large capacitor banks, or arrays, using flexible substrates that can then subsequently be assembled within a low volume package for attachment to the final device.

SUMMARY

It is an object of the invention to provide a large capacitor utilizing the advantages offered by MLCC's.

A particular feature of the invention is the ability to provide a large capacitor which is less susceptible to damage from mechanical shock.

These and other advantages, as will be realized, are provided in a flexible circuit. The flexible circuit has a flexible substrate comprising at least one first conductive trace and at least one second conductive trace. A first termination trace is in electrical connection with each first conductive trace and a second termination trace is in electrical connection with each second conductive trace. A multiplicity of multi-layered ceramic capacitors is provided wherein each multi-layered ceramic capacitor comprises interleaved conductors wherein alternate conductors are terminated to a first external termination and adjacent conductors are terminated to a second external termination. Each multi-layered ceramic capacitor, either single or stacked, is mounted on the flexible substrate with the first termination in electrical contact with the first conductive trace and the second termination in electrical contact with the second conductive trace. A housing with the flexible substrate is received in the housing. A first lead tab is in electrical contact with the first termination wherein the first lead tab extends from the housing.

DESCRIPTION

The present invention is directed to large capacitors formed from MLCC's in an array on a flexible substrate. More specifically, the present invention is related to a large capacitor which can be formed from an array of MLCC's on a flexible support wherein the flexible support can be configured for insertion into a container.

The invention will be described with reference to the figures forming an integral, non-limiting, component of the disclosure. The figures are intended to facilitate an understanding of the invention and are not intended to limit the invention in any way. Throughout the figures various elements will be numbered accordingly.

Figure 1:
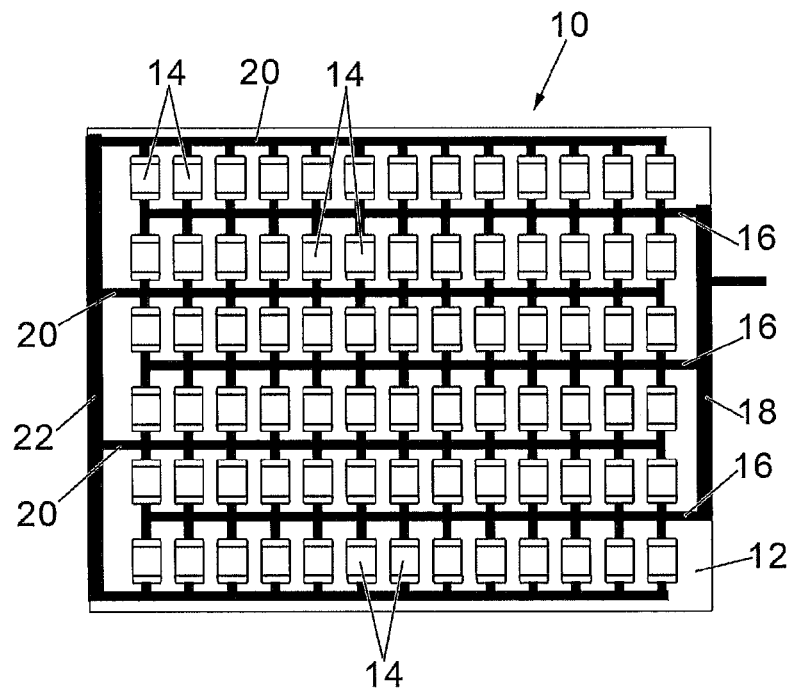
FIG. 1 is a top schematic view of an embodiment of the invention.

An embodiment of the invention will be described with reference to FIG. 1. In FIG. 1, an array, 10 is illustrated in schematic view comprising a multiplicity of MLCC's, 14, on a flexible substrate, 12. The MLCC's each have terminations of opposing polarity wherein all terminations of a first polarity are in electrical contact with conductive traces, 16, which are in electrical contact with a first termination trace, 18. All terminations of a second polarity are in electrical contact with conductive traces, 20, which are in electrical contact with a second termination trace, 22. One termination trace is typically designated as the anode and the other as the cathode even though these designations may be arbitrary for these non-polar capacitors. It would be readily apparent to one of skill in the art that the conductive layers and termination traces are electrically isolated from each other to avoid shorting in the device. Though illustrated in FIG. 1 as a 6×13 array of MLCC's this number is shown for convenience allowing for a complete array to be illustrated in a single undisrupted figure. The number of MLCC's in the array is not particularly limited herein and may reach very large numbers depending on the application. Typical applications may have thousands of MLCC's on a single flexible substrate, depending on the physical size of the MLCC's.

Figure 2:
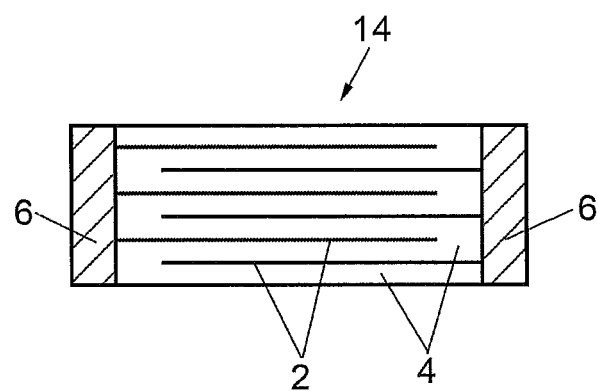
FIG. 2 is a side cross-sectional schematic view of an MLCC.

An MLCC is illustrated in cross-sectional schematic isolated view in FIG. 2. In FIG. 2, the MLCC, generally represented at 14, comprises alternating interleaved conductive layers, 2, wherein adjacent conductive layers terminate at different external terminations, 6. A dielectric, 4, is between adjacent conductive layers. The MLCC may comprise floating electrodes, shields layers, and non-conductive coatings as well known in the art. The material of construction for the conductive layers and dielectric is not particularly limited herein. Conductive metals are particularly preferred as conductive layers with precious metals or base metals being particularly preferred. Ceramic dielectrics are particularly preferred.

Figure 3:
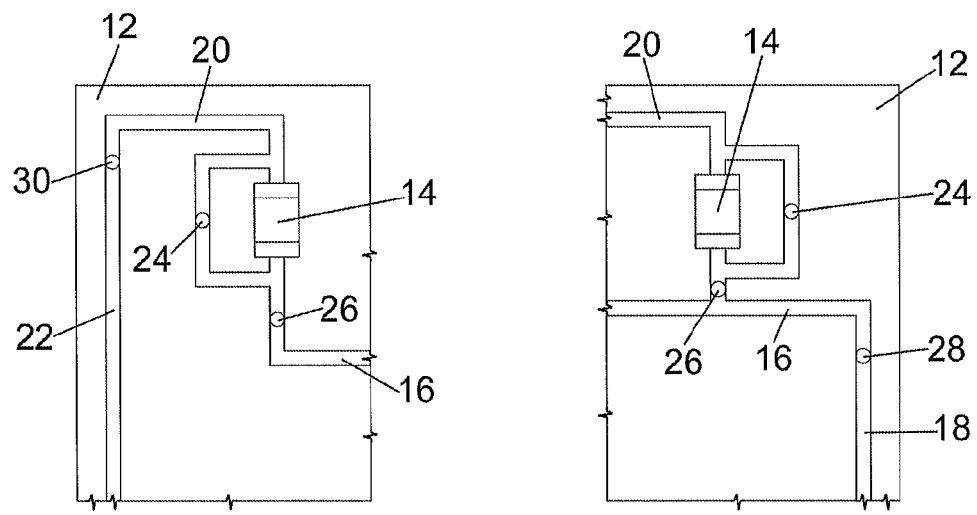
FIGS. 3 and 3A are schematic partial views of an embodiment of the invention.
Figure 3A:
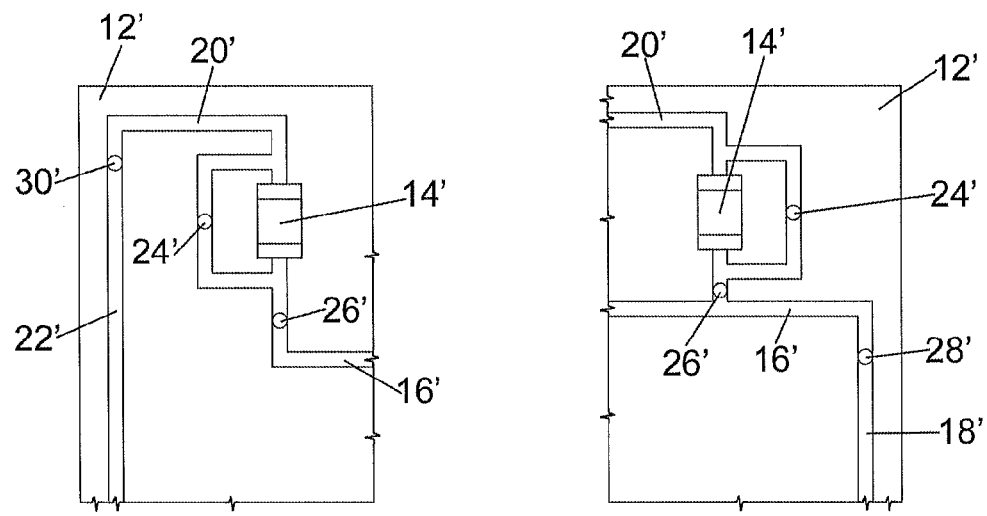

An embodiment of the invention is illustrated in partial cut-away schematic view in FIGS. 3 and 3A wherein FIG. 3 is a first side and FIG. 3A is the opposite side of the flexible substrate. In FIGS. 3 and 3A the MLCC's, 14, flexible substrate, 12, conductive traces, 16 and 20, and termination traces, 18 and 24, are as described relative to FIG. 1. In FIGS. 3 and 3A auxiliary functionality, 24, is provided in electrical parallel with an MLCC. The auxiliary functionality may be a resistor or a fuse with a fuse in series and a resistor in parallel to the capacitor being preferred since this will allow the circuit to continue to function if the capacitor fails in a short circuit mode. A second auxiliary functionality, 26, may be in series with at least one of the MLCC and the auxiliary functionality wherein the second auxiliary functionality may be a fuse or a resistor with a fuse being a preferred embodiment. It is preferably that up to all of the MLCC's on the flexible support comprises at least one of an auxiliary functionality in electrical parallel with the MLCC or at least one second auxiliary functionality in electrical series with the MLCC. Populating both sides of the flexible substrate maximizes the volumetric efficiency. Vias, 28 and 30, through the flexible substrate can be used to connect the termination traces or conductive traces of common polarity on opposing sides of the flexible substrate thereby allowing the cathode and anode interconnects to be arranged on different sides of the circuit. This has the advantage of minimizing the chances of arcing and shorting with subsequent failures when the circuit is packaged.

The flexible circuit board, or flexible substrate, is not particularly limited herein. The flexible substrate is defined herein as a film which can be bent to conform to a semicircle with a radius of no less than 1 inch without cracking or breaking at the fold. More preferably, the film can bend to conform to a semicircle with a radius of no less than ½ inch without cracking or breaking at the fold and even more preferably the film can bend to conform to a semicircle with a radius of no less than 1/16 inch without cracking or breaking at the fold. Flexible substrates suitable for demonstration of the invention have a preferred volume resistivity of at least about $5.0 \times 10^6$ to no more than about $1.5 \times 10^{11}$ Ohms-cm. The preferred density is at least about 1 to no more than about 2.5 g/cc. The flexible substrate has a preferred permittivity @1 MHz-1 GHz of at least about 2 to no more than about 5 and a loss tangent @ 1 MHz-1 Ghz of at least about $5 \times 10^{-4}$ to no more than about $2.0 \times 10^{-2}$. The flexible substrate preferably has a dielectric breakdown of at least 50 to no more than 300 V/micron and a preferred moisture absorption of less than 2.5 wt % and more preferably 0.01 to 2.5 wt %. The flexible substrate preferably has a flammability rating (as defined by UL-94) of V0 and a tensile strength of at least about 10 MPa to no more than about 300 MPa. The flexible substrate has a preferred thermal conductivity of about 0.05 to about 0.4 W/m/° K. The preferred flexible substrate can preferably sustain a continuous surface temperature of at least about 50° C., more preferably at least 100° C., even more preferably at least 200° C. and even more preferably at least 230° C. with a degradation temperature of at least about 200° C., more preferably at least 300° C. and even more preferably at least 350° C. Particularly preferred flexible substrates have a coefficient of thermal expansion of at least about 5 to no more than about 25 ppm/° C. below the glass transition temperature Tg in the x-y axis and at least 5 to no more than about 80 ppm/° C. below Tg in the z-direction. The flexible substrate preferably has a glass transition temperature of at least about 50° C. to no more than about 300° C. Particularly suitable flexible circuit materials are FR-4, polytetraflouroethylene (PTFE) or Polyimide all of which are widely available from a large variety of commercial sources or COUPLER™ MIP supplied by Al Technology Inc. The relevant properties of each preferred flexible substrate is provided in Table 1.

Table 1:

TABLE 1

| Characteristics | FR-4 | PTFE | Polyimide | COUPLER ™-MIP |
| --- | --- | --- | --- | --- |
| Volume Resistivity (Ohms-cm) | $1 \times 10^8$ | $0.1 \times 10^8$ | $1000 \times 10^8$ | $10 \times 10^8$ |
| Density (g/cc) | 1.2 | 2.2 | 1.4 | 1.4 |
| Permittivity @ 1 MHz-1 GHz | 4.4 | 2.6-4.0 | 4.1 | 2.9 |

TABLE 1-continued

| Characteristics | FR-4 | PTFE | Polyimide | COUPLER™-MIP |
|---|---|---|---|---|
| Loss Tangent @ 1 MHz-1 GHz | 0.018 | 0.001 | 0.006 | 0.002 |
| Dielectric Breakdown (V/Micron) | 100 | 240 | 276 | 220 |
| Moisture Absorption (%) | 1.0-1.5 | 0.02 | 1.0-2.0 | 0.02 |
| Flammability (UL-94) | V0 | V0 | V0 | V0 |
| Tensile Strength (MPa) | 63 | 22 | 231 | 208 |
| Thermal Conductivity (W/m/° K) | 0.2 | 0.3 | 0.12 | 0.3 |
| Continuous Service Temperature (° C.) | >100 | >200 | >200 | >230 |
| Degradation Temperature (° C.) | 290 | >300 | >300 | >350 |
| Coefficient of Thermal Expansion (X-Y Axis below Tg) ppm/° C. | 20 | 12 | 20 | 12 |
| Coefficient of Thermal Expansion (Z-axis below Tg) ppm/° C. | 60 | 12 | 20 | 12 |
| Glass Transition Temperature (° C.) | 134-178 | Not defined (Low) | 250 | >220 |
| Relative Cost | 1 | 4 | 4-100 | 4 |

The MLCC's can be assembled onto the flexible substrate using a suitable solder or conductive adhesive. The flexible substrate itself is flexible with conductive traces and pads typically made using a conductive material such as a metal. Copper traces are particularly suitable for demonstration of the invention.

A particular advantage of the array is the flexibility in packaging. The array can be folded or rolled to minimize the space required thereby allowing for a large ratio of capacitance to volume.

Figure 4:
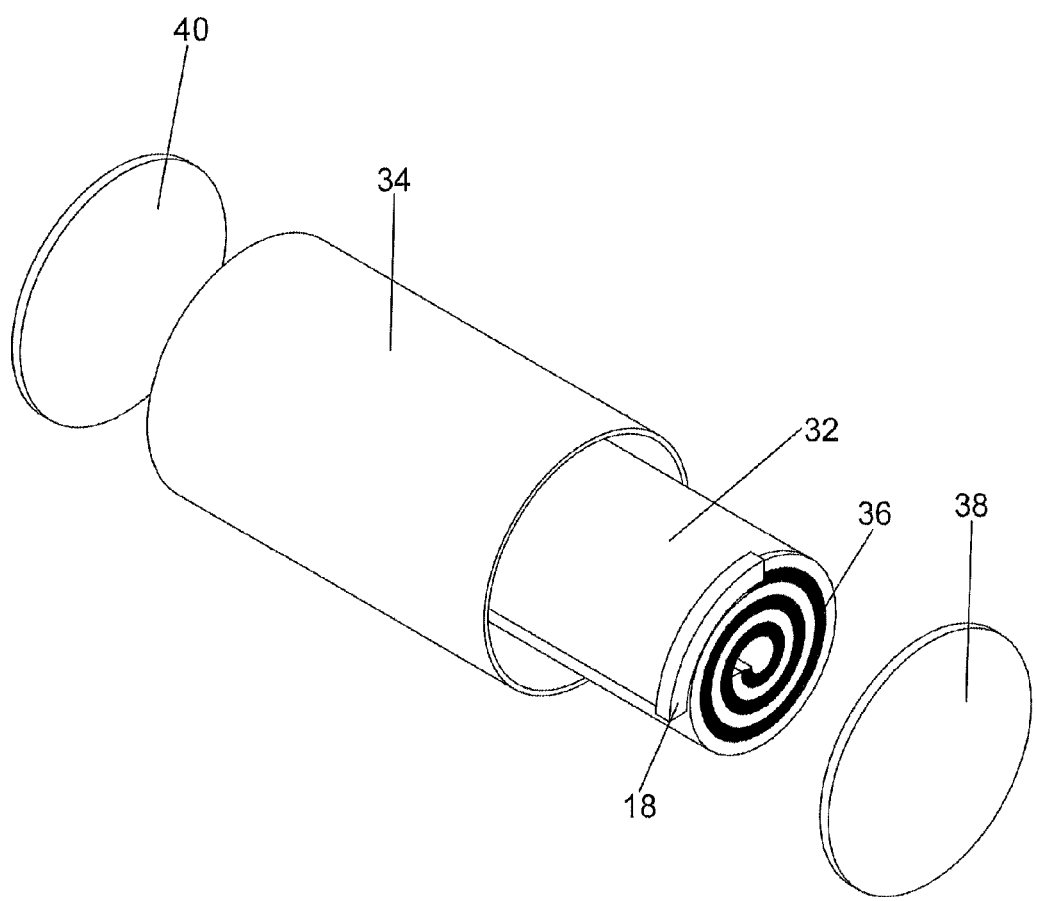
FIG. 4 is a partially exploded perspective schematic view of an embodiment of the invention.

An embodiment of the invention is illustrated in schematic view in FIG. 4. In FIG. 4, the array is rolled on an axis which is perpendicular to the termination traces to form a rolled flexible circuit, 32, which is then inserted into an insulated housing, 34. A termination trace, 18, which extends to the edge of the flexible substrate and preferably wraps at least partially around the edge of the flexible substrate is in electrical contact with a conducting lid 38. The termination trace of opposing polarity, which is not visible in this view, would be in electrical contact with a second conducting lid, 40, of opposite polarity than conductive lid 38. An optional, but preferred, non-conductive spacer, 36, can be interleaved with the rolled flexible circuit to protect against arcing between capacitors in adjacent layers. If only one side of the flexible substrate has MLCC's thereon the spacer is not necessary. Leads can be electrically connected to each conductive lid for electrical connection to a circuit. Potting material may be included to fill the space within the assembled device.

Figure 5:
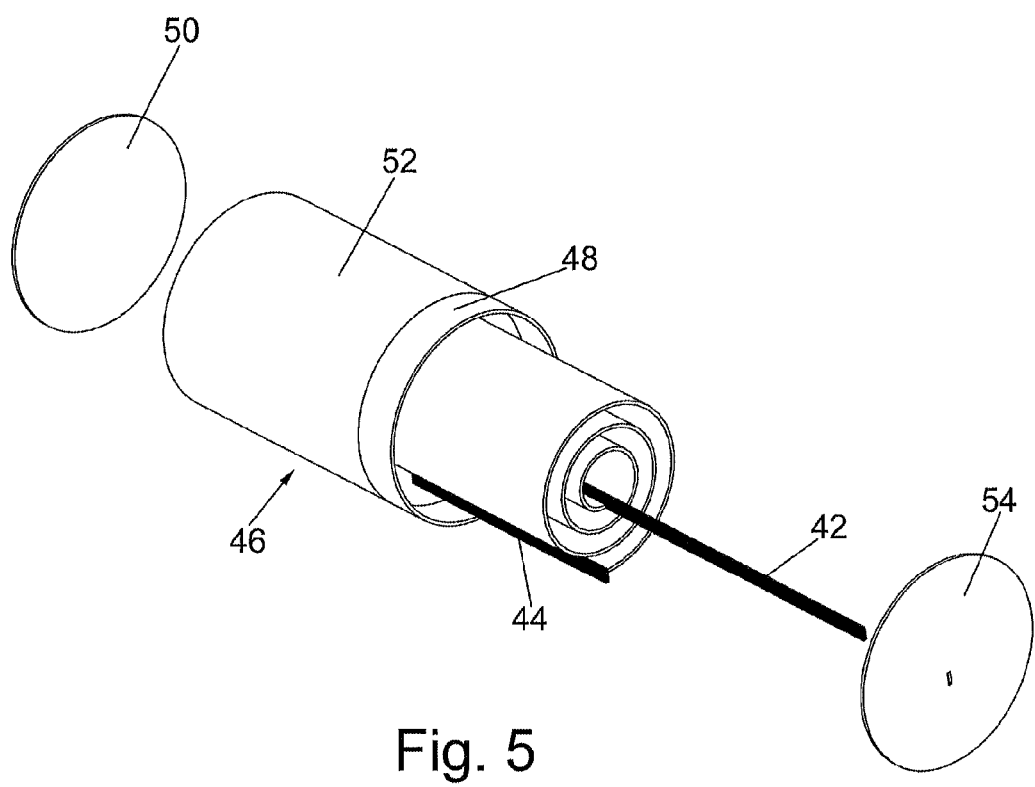
FIG. 5 is a partially exploded perspective schematic view of an embodiment of the invention.

An embodiment of the invention is illustrated in partial exploded schematic view in FIG. 5. In FIG. 5 the flexible substrate is rolled on an axis which is parallel to the termination traces. A first lead tab, 42, referred to herein as an anode lead even though the anode and cathode may be reversed, is in electrical contact with a termination trace of first polarity wherein the first lead tab extends beyond the body of the final capacitor. A second lead tab, 44, is in electrical contact with a different termination trace. The rolled flexible substrate is inserted into a housing, generally represented at 46, The housing preferably comprises a conducting portion, 48, which is in electrical contact with the second lead tab, 44, wherein the conducting portion is in electrical contact with a conducting lid, 50. An insulating sleeve, 52, may be provided to electrically isolate the conductive portion from other components. An insulated lid, 54, allows the first lead tab, 42, to pass there through such that the first lead tab either is an external termination or is in electrical contact with an external termination such as a lead. It is preferably that the lead tabs be connected to the termination traces prior to rolling or insertion into the housing. The lead tab can be connected to the termination traces by welding, solder or other adhesive.

Figure 6:
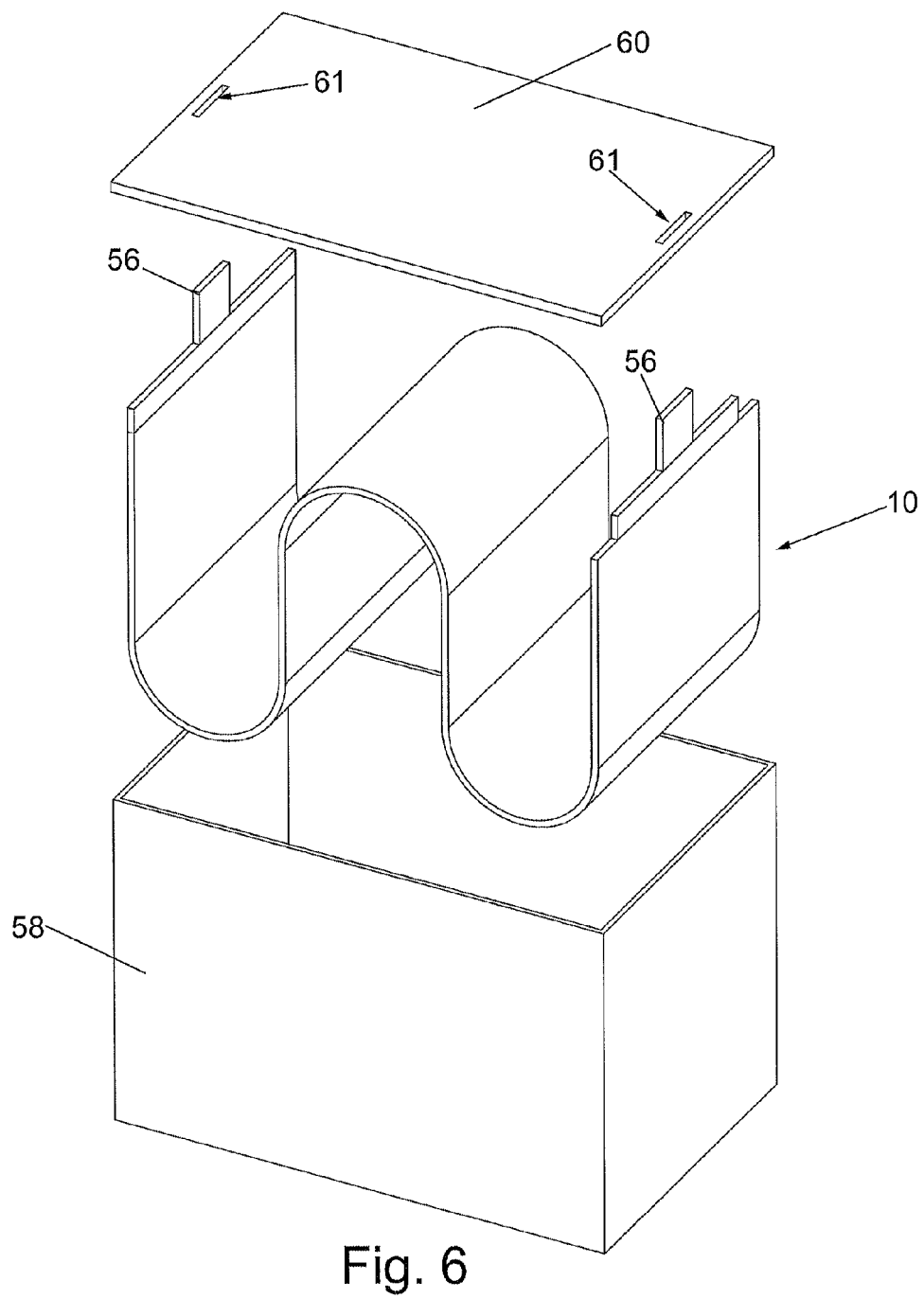
FIG. 6 is an exploded perspective schematic view of an embodiment of the invention.

An embodiment of the invention is illustrated in exploded schematic view in FIG. 6. In FIG. 6 the array, 10, is serpentine folded parallel to the termination traces. Leads, 56, are attached to each termination trace and the array is folded such that the leads extend from the box when the folded array is inserted in the insulated box, 58. A lid, 60, comprising voids, 61, for receiving the leads, 56, is sealed to the box with the leads extending through the lid for electrical connectivity to a circuit or to leads.

The ability to fold the assembled flexible capacitor array allows folded circuits to be accommodated within a variety of shapes. The initial assembly of components can be adjusted to maximize the subsequent packing density. Potting material is preferably in the vacant areas within the assembled capacitor of any embodiment described herein.

Figure 7:
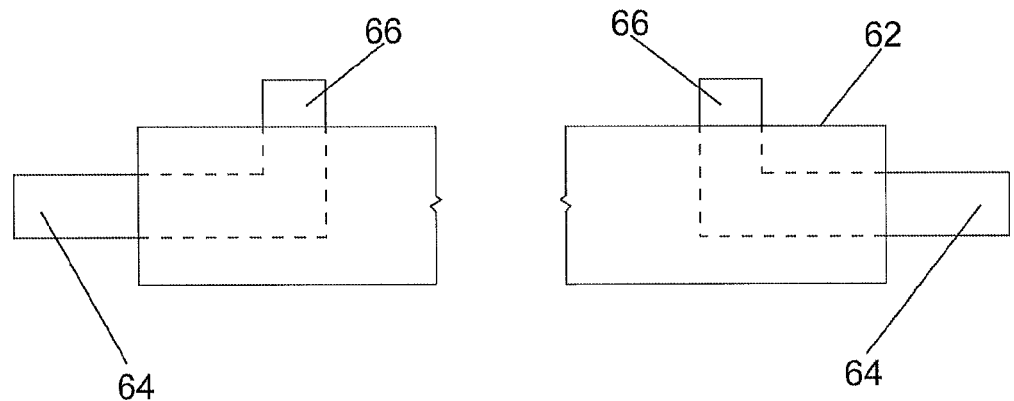
FIG. 7 is a partial schematic view of a winding shaft of the invention.
Figure 8:
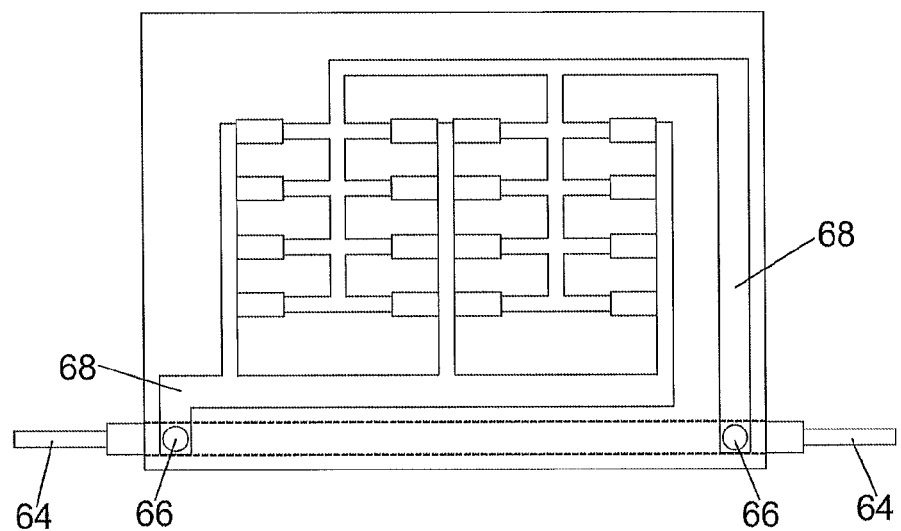
FIG. 8 is a top schematic view of an embodiment of the invention.
Figure 9:
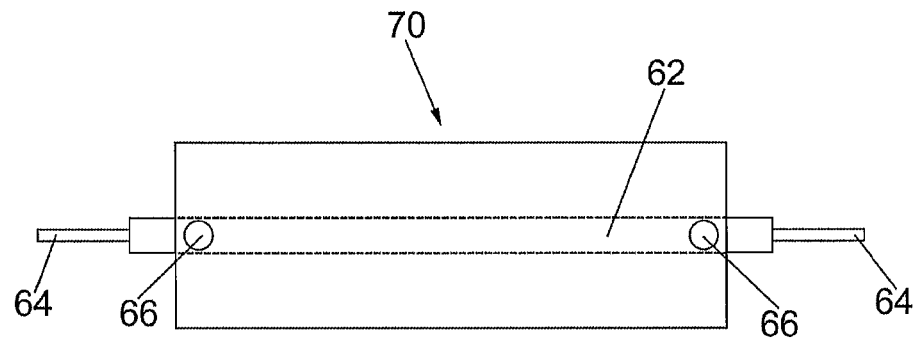
FIG. 9 is a side cross-sectional schematic view of an embodiment of the invention.

An embodiment of the invention is illustrated in schematic partial side view in FIG. 7. In FIG. 7, an insulated winding shaft, 62, is used as a core upon which the array is wrapped to form a coil. Termination pins, 64, extend from the winding shaft and will become the external terminations or electrical contact points for leads. Termination studs, 66, each of which is in electrical contact with one termination pin, extends perpendicular to the winding shaft and functions as a lead tab. FIG. 8 is a schematic illustration of the winding shaft as attached to the array. Each termination stud, 66, extend through vias in the array and forms an electrical connection with a termination trace, 68. The termination stud may be flared or adhered to the termination trace by solder or conductive adhesive. The array is wrapped around the winding shaft by winding the flexible substrate around the winding shaft to form a wound capacitor, 70, as illustrated in FIG. 9 in cross-sectional schematic view. After the winding is complete, the loose end is secured to the roll via adhesive, tape, or by soldering or any number of suitable securing methods. The wound capacitor is placed into a formed housing with integral electrical terminals which extend through the container for electrical connection between the capacitor and the circuit board.

Figure 10:
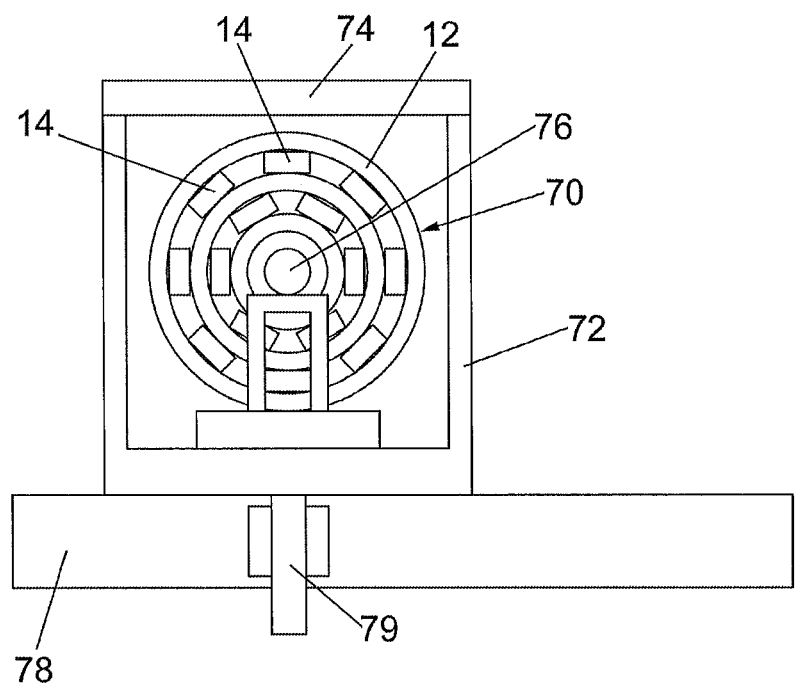
FIG. 10 is a side cross-sectional schematic view of an embodiment of the invention.

A module assembly is illustrated in FIG. 10 in cross-sectional schematic view wherein the wound capacitor, 70, comprising MLCC's, 14, on a flexible substrate, is contained in a housing, 72, with a lid, 74, thereon. The termination pins, which are obscured from view, are electrically connected to a termination, 76, which is in electrical connection with a trace on a circuit board, 78, through a pin, 79. Potting material is preferable in the vacant areas within the housing.

A thermoplastic injection molding process may be utilized to mold a housing with integrated electrical contact pins. The housing may also be formed by other methods such as extrusion, die cast, stamping, or any other method or material to make a suitable container or housing. Once the connection of the flex termination leads are connected to the integral terminals, the container may be filled with a potting material, silicone being preferred or other materials of suitable properties. Once the potting process is complete, it may also be desirable to place a lid over the module to provide a totally encapsulated capacitor. The lid is optional and dependent upon the type of potting material used. The potting material provides several advantages including providing environmental protection against harsh environments and protection against mechanical shock and vibration.

Figure 11:
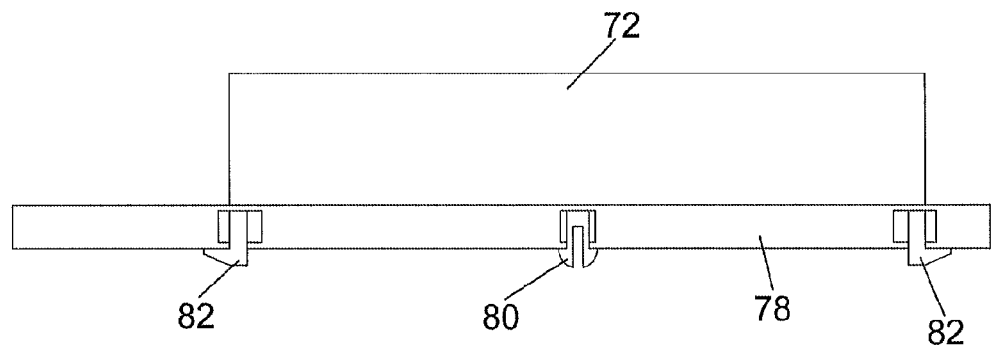
FIG. 11 is a side schematic view of an embodiment of the invention.

An embodiment of the invention is illustrated in schematic side view in FIG. 11. In FIG. 11, a housing, 72, is shown attached to a circuit board, 78, by mechanical constraints. Though not limited thereto, mechanical constraints are preferable integral to, or attached to, the housing and function as placement guides and secure, preferably reversibly, the device to the flexible substrate. Particularly suitable mechanical constraints include a split mushroom head, 80, and a snap pin, 82, as shown. Screws, spring latches, and other mechanical constraints may be used, either as singles or multiples or in combination depending on the application. External mechanical constraints can also be utilized and designed to meet application requirements.

Figure 12:
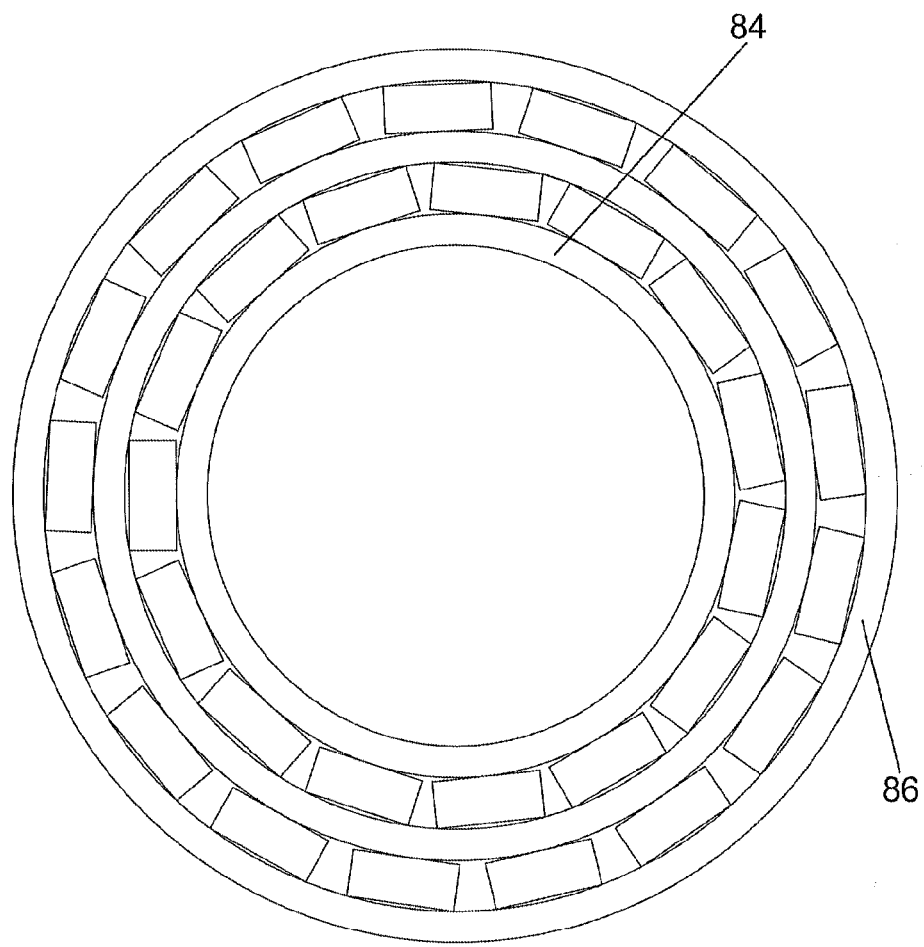
FIG. 12 is a top cross-sectional schematic view of an embodiment of the invention.
Figure 13:
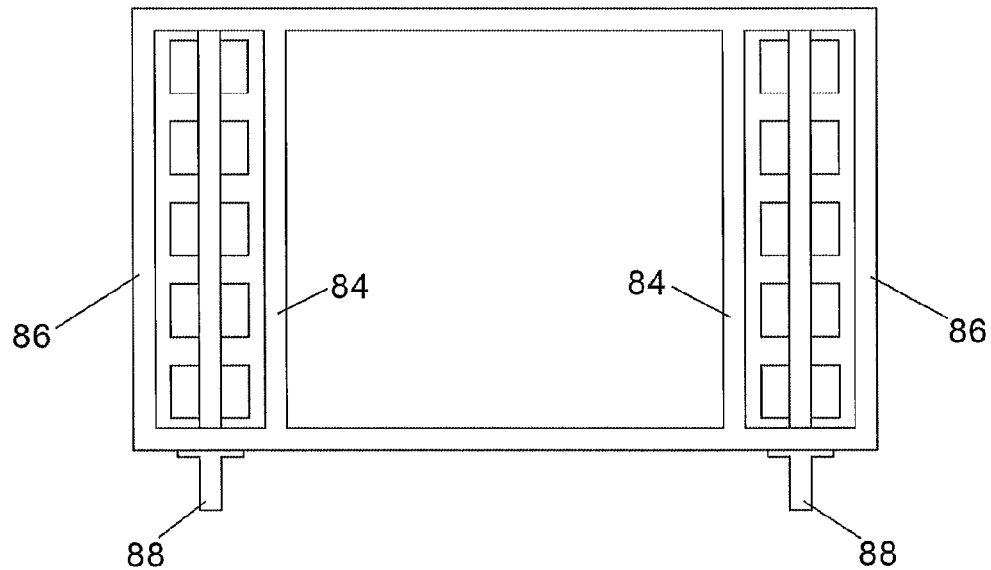
FIG. 13 is a side cross-sectional schematic view of an embodiment of the invention.

An embodiment of the invention is illustrated is top cross-sectional schematic view in FIG. 12 and in side cross-sectional schematic view in FIG. 13. In FIG. 12, an embodiment as illustrated in FIG. 5, with lead tabs extending in the same direction can be wrapped around a central core, 84, and inserted in an outer core, 86, to form a donut shape with lead tabs extending from one face of the donut shaped device for electrical connection to leads, 88.

Figure 14:
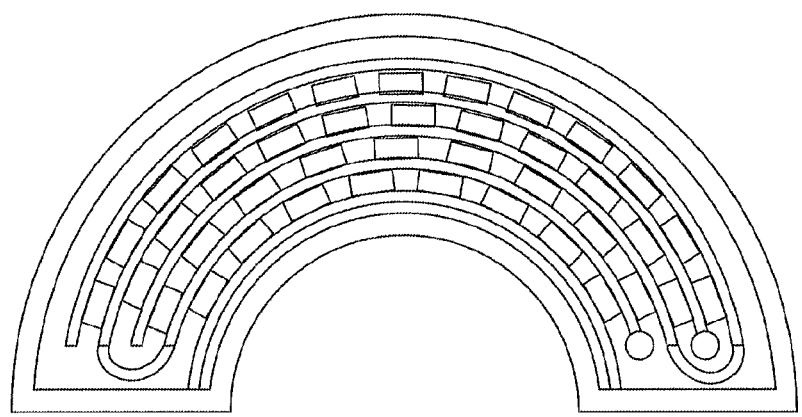
FIG. 14 is a top cross-sectional schematic view of an embodiment of the invention.

An embodiment of the invention is illustrated in top cross-sectional view in FIG. 14 wherein the array is serpentine folded and inserted into a semi-circle, thereby providing a customized shape.

Figure 15:
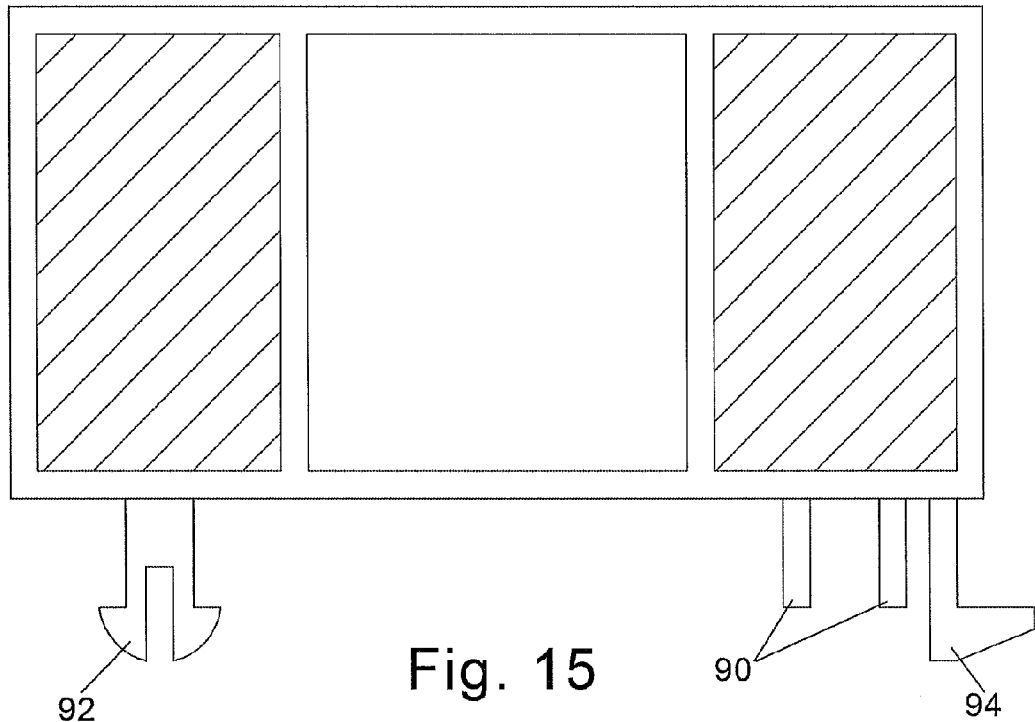
FIG. 15 is a side cross-sectional schematic view of an embodiment of the invention.

An embodiment of the invention is illustrated in cross-sectional side schematic view in FIG. 15 wherein leads, 90, of opposing polarity extend from a device. Mechanical constraints, 92 and 94, which are not interchangeable, restrict the orientation of the device to a circuit board when the circuit board has selectively mating mechanical constraint receiving voids.

Figure 16:
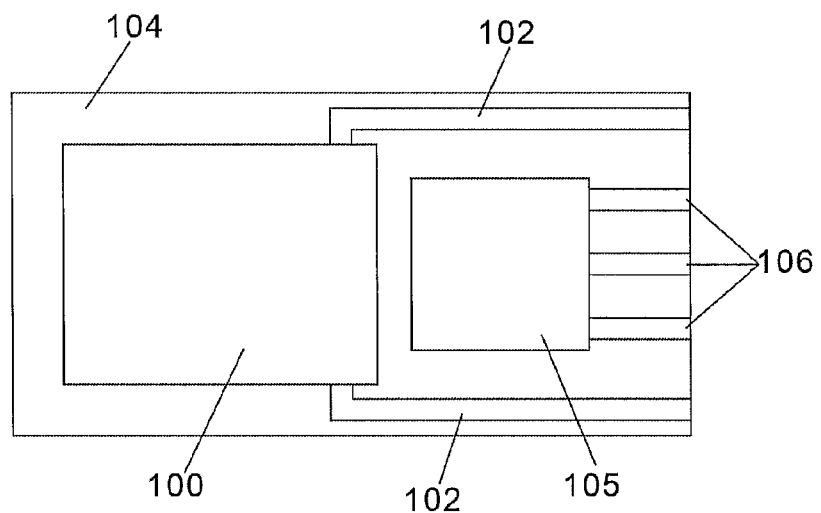
FIG. 16 is a top schematic view of an embodiment of the invention.

An embodiment of the invention is illustrated in schematic view in FIG. 16. In FIG. 16, an array of capacitors, 100, with termination traces, 102, are on a flexible substrate, 104, forming a flexible circuit. A control circuit, 105, with electrical connectivity, 106, is on the same flexible substrate thereby providing multiple functionalities on a common flexible substrate.

Figure 17:
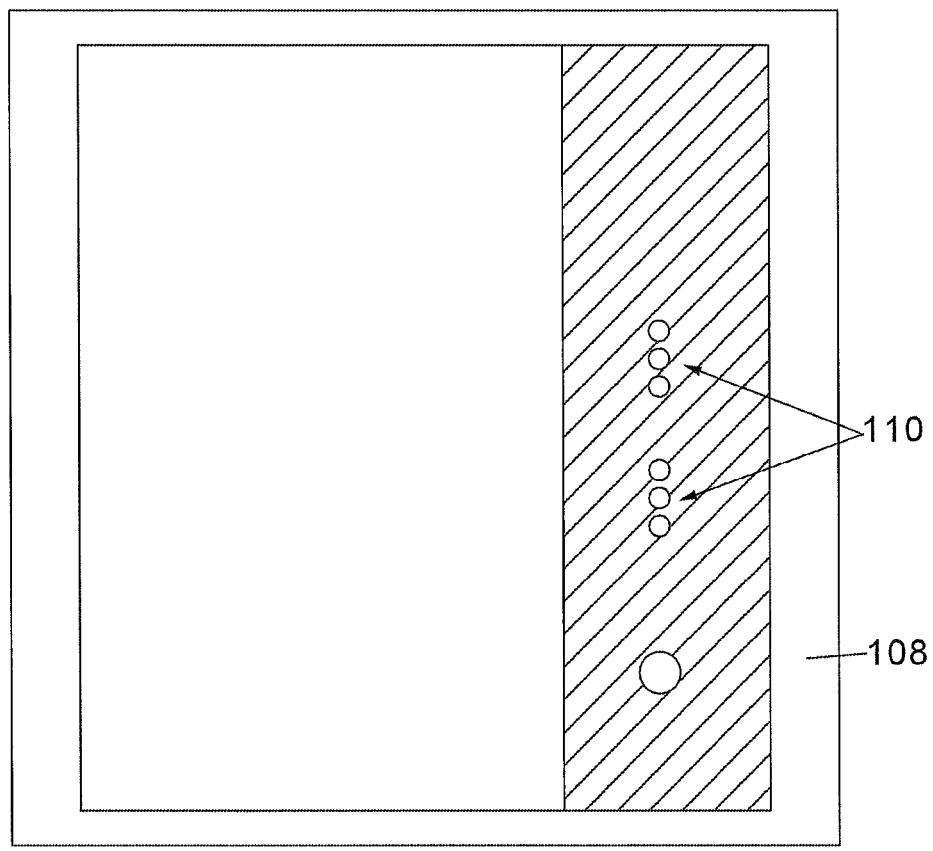
FIG. 17 is a top schematic view of an embodiment of the invention.
Figure 18:
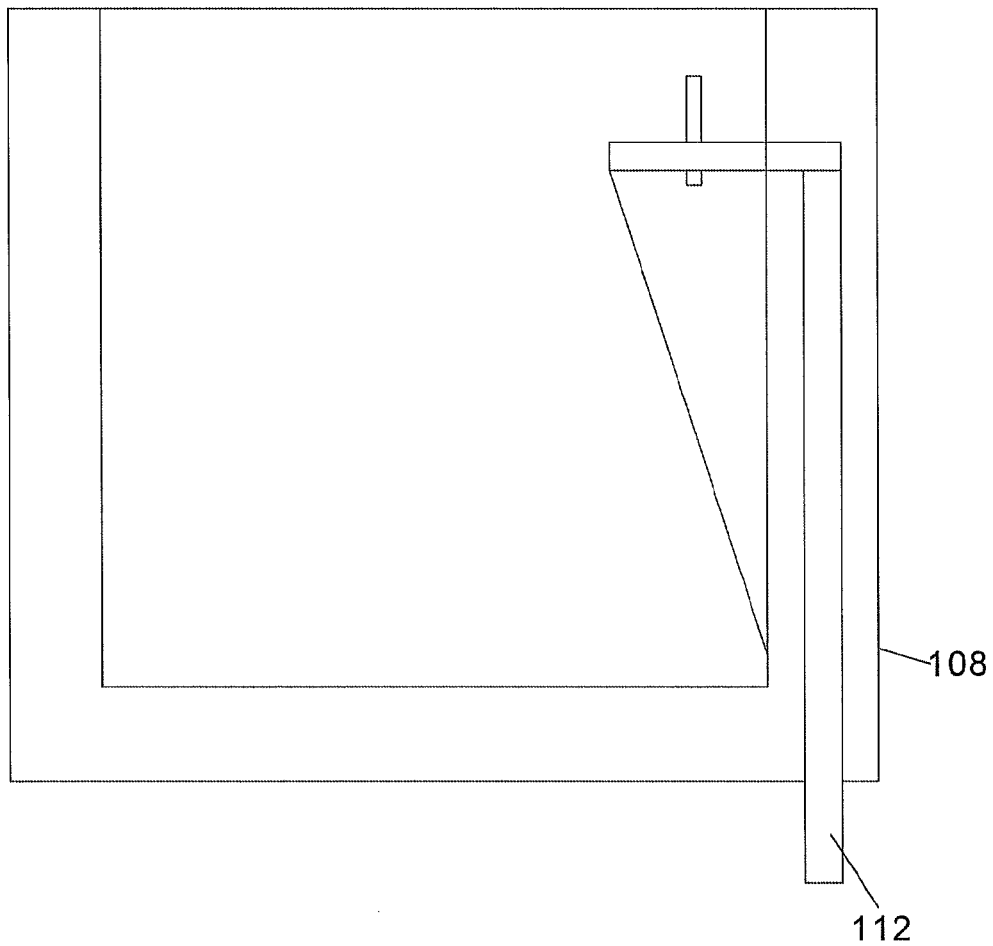
FIG. 18 is a side cross-sectional schematic view of an embodiment of the invention.
Figure 19:
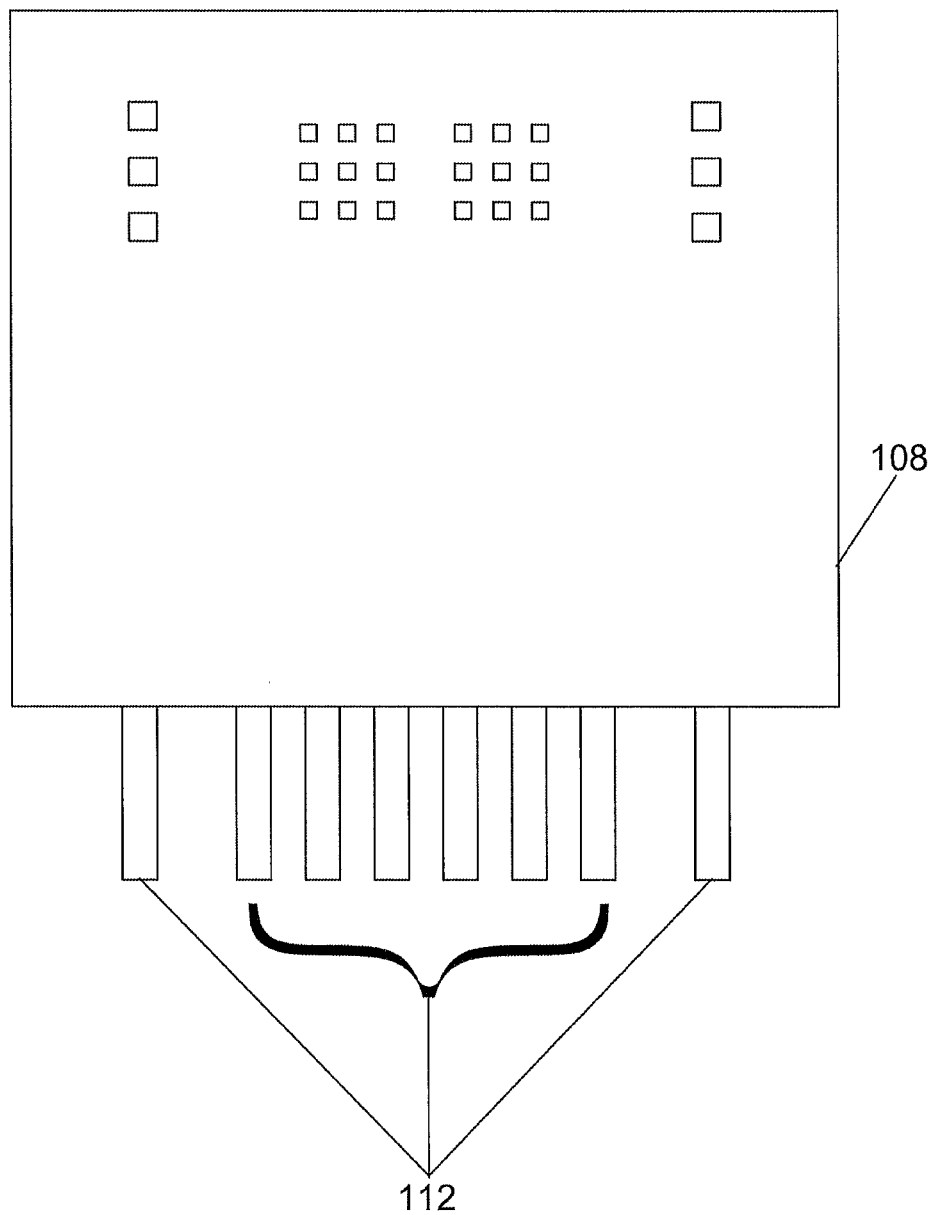
FIG. 19 is a side schematic view of an embodiment of the invention.
Figure 20:
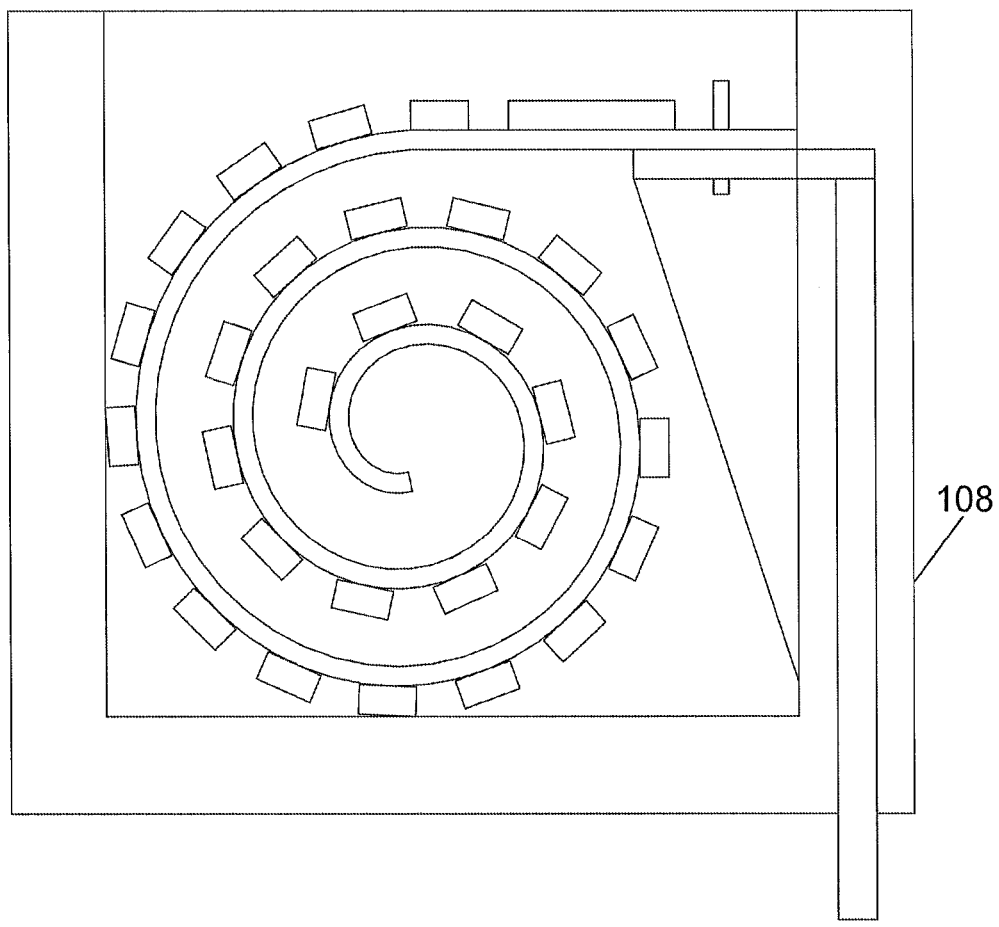
FIG. 20 is a side cross-sectional schematic view of an embodiment of the invention.

An embodiment of a housing for the embodiment of FIG. 16 is illustrated in FIG. 17 in top schematic view, in FIG. 18 in side schematic view and in front schematic view in FIG. 19. An embodiment with the array inserted in the housing is illustrated in side cross-sectional schematic view in FIG. 20. The housing, 108, has integral thereto contact pins, 110, which form electrical contact with the termination traces or electrical connectivity of the flexible electrical circuit as illustrated in FIG. 16. The contact pins, 110, are in electrical contact with leads, 112, of FIG. 19, which will be attached to a circuit board as would be understood to one of skill in the art thereby providing electrical functionality in a compact space. All of the leads, 112, may be active or some may be dummy leads for defining orientation.

The flexible connection formed between the MLCC and package provides a large ceramic capacitor that is highly resistant to mechanical shock damage. The flexible circuit can be designed so that the possibility of arcing and shorting can be minimized as described previously. In addition to this insulating layers can be added between the rolled and folded circuitry to further minimize this risk. It is also possible to fill the package with insulating foam or gel to further protect the circuit.

The invention has been described with particular reference to preferred embodiments without limit thereto. One of skill in the art would realize additional embodiments and improvements which are not specifically enumerated but which are within the scope of the invention as specifically set forth in the claims appended hereto.

What is claimed is:

1. A flexible circuit comprising:
a flexible substrate comprising at least one first conductive trace and at least one second conductive trace;
a first termination trace in electrical connection with each said first conductive trace;
a second termination trace in electrical connection with each said second conductive trace;
a multiplicity of multi-layered ceramic capacitors, or stack of multi-layered ceramic capacitors, wherein each multi-layered ceramic capacitor of said multi-layered ceramic capacitors comprises interleaved conductors wherein alternate conductors are terminated to a first external termination and adjacent conductors are terminated to a second external termination;
wherein each multi-layered ceramic capacitor is mounted on said flexible substrate with said first external termination in electrical contact with said first conductive trace and said second external termination in electrical contact with said second conductive trace;
a housing with said flexible substrate received in said housing;
a first lead tab in electrical contact with said first termination wherein said first lead tab extends from said housing and further comprising a control circuit on said flexible substrate.

2. The flexible circuit of claim 1 further comprising a second lead tab in electrical contact with said housing.

3. The flexible circuit of claim 1 further comprising a second lead tab in electrical contact with said second termination trace wherein said second lead tab extends from said housing.

4. The flexible circuit of claim 1 further comprising a winding shaft wherein said first lead tab is a termination stud integral to said winding shaft.

5. The flexible circuit of claim 4 wherein said flexible substrate is wrapped around said winding shaft.

6. The flexible circuit of claim 5 wherein said winding shaft further comprises at least one termination pin parallel to said winding shaft.

7. The flexible circuit of claim 1 further comprising a lid for sealing said housing.

8. The flexible circuit of claim 7 wherein said lid is conductive.

9. The flexible circuit of claim 7 wherein said first lead tab extends through said lid.

10. The flexible circuit of claim 1 comprising at least one multi-layered ceramic capacitor on each side of said flexible substrate.

11. The flexible circuit of claim 1 further comprising at least one auxiliary functionality component in electrical parallel with one said multi-layered ceramic capacitor.

12. The flexible circuit of claim 11 wherein said auxiliary functionality component is selected from the group consisting of a fuse and a resistor.

13. The flexible circuit of claim 1 further comprising at least one auxiliary functionality component in electrical series with one said multi-layered ceramic capacitor.

14. The flexible circuit of claim 13 wherein said auxiliary functionality component is selected from the group consisting of a fuse and a resistor.

15. The flexible circuit of claim 1 wherein said flexible circuit is wound on an axis which is perpendicular to said first termination trace.

16. The flexible circuit of claim 1 wherein said flexible circuit is wound on an axis which is parallel to said first termination trace.

17. A flexible circuit comprising:
- a flexible substrate comprising at least one first conductive trace and at least one second conductive trace;
- a first termination trace in electrical connection with each said first conductive trace;
- a second termination trace in electrical connection with each said second conductive trace;
- a multiplicity of multi-layered ceramic capacitors, or stack of multi-layered ceramic capacitors, wherein each multi-layered ceramic capacitor of said multi-layered ceramic capacitors comprises interleaved conductors wherein alternate conductors are terminated to a first external termination and adjacent conductors are terminated to a second external termination;
- wherein each multi-layered ceramic capacitor is mounted on said flexible substrate with said first external termination in electrical contact with said first conductive trace and said second external termination in electrical contact with said second conductive trace;
- a housing with said flexible substrate received in said housing;
- first lead tab in electrical contact with said first termination wherein said first lead tab extends from said housing, and
- wherein said flexible circuit is serpentine folded.

18. The flexible circuit of claim 1 wherein said housing comprises contact pins in electrical contact with at least one of said control circuit or said multi-layered ceramic capacitor.

19. The flexible circuit of claim 1 further comprising at least one mechanical constraint.

20. The flexible circuit of claim 19 wherein said mechanical constraint is integral to said housing.

* * * * *